United States Patent
Zhang (10) Patent No.: US 10,720,610 B2
(45) Date of Patent: Jul. 21, 2020

(54) METHOD OF FABRICATING GRAPHENE MATERIAL, OLED ILLUMINATING DEVICE, AND DISPLAY DEVICE

(71) Applicant: WUHAN CHINA STAR OPTOELECTRONICS SEMICONDUCTOR DISPLAY TECHNOLOGY CO., LTD., Wuhan, Hubei (CN)

(72) Inventor: Yue Zhang, Hubei (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 0 days.

(21) Appl. No.: 16/349,651

(22) PCT Filed: Jan. 22, 2019

(86) PCT No.: PCT/CN2019/072714
§ 371 (c)(1),
(2) Date: May 14, 2019

(65) Prior Publication Data
US 2020/0203670 A1 Jun. 25, 2020

(51) Int. Cl.
*H01L 29/16* (2006.01)
*H01L 51/56* (2006.01)
*H01L 51/52* (2006.01)
*H01L 51/50* (2006.01)

(52) U.S. Cl.
CPC .......... *H01L 51/56* (2013.01); *H01L 51/5056* (2013.01); *H01L 51/5072* (2013.01); *H01L 51/5212* (2013.01); *H01L 51/5231* (2013.01); *H01L 2251/305* (2013.01)

(58) Field of Classification Search
CPC combination set(s) only.
See application file for complete search history.

(56) References Cited

U.S. PATENT DOCUMENTS

2013/0171355 A1* 7/2013 Wang ................ B05D 1/18
427/337

* cited by examiner

*Primary Examiner* — Mion M Rahman
(74) *Attorney, Agent, or Firm* — Mark M. Friedman (57) ABSTRACT

A method of fabricating a graphene material, an organic light-emitting diode (OLED) illuminating device, and a display device are provided. The method of fabricating the graphene material has steps of synthesizing and reducing a target object. The fabricated graphene material has advantages of good quality and no impurities. The OLED illuminating device has a substrate, an anode layer, a cathode layer, an organic coating layer, and a graphene material and/or a graphene material layer. The graphene material is doped in at least one of the anode layer, the cathode layer, and the organic coating layer, and/or disposed between an anode and the substrate and/or between the organic coating layer and the cathode layer to form the graphene material layer, which has excellent thermal conductivity, and heat within the OLED illuminating device can be effectively and quickly conducted. The display device has the OLED illuminating device, which increase service life.

10 Claims, 1 Drawing Sheet

METHOD OF FABRICATING GRAPHENE MATERIAL, OLED ILLUMINATING DEVICE, AND DISPLAY DEVICE

FIELD OF DISCLOSURE

The present disclosure relates to displays, and more particularly, to a method of fabricating a graphene material, an organic light-emitting diode (OLED) illuminating device, and a display device.

BACKGROUND OF DISCLOSURE

Organic light-emitting diodes (OLEDs), also known as organic electroluminescent displays (OELDs), are an optoelectronic technology that uses organic semiconductor materials to generate reversible color changes under current driving to achieve colorful displaying. Unlike a traditional display technology, the OLED display technology does not need a backlight and uses very thin organic material coating layers and glass substrates. These organic materials illuminate when a current passes through. Moreover, an OLED display screen can be made to be relatively light and thin, has a relatively great viewing angle, and can significantly save electrical power.

A basic structure of the OLEDs is a sandwich structure, which is packaged by a thin and transparent indium tin oxide (ITO) with semiconductor characteristics connected to a positive electrode of power, and another metal cathode is further added. An entire structural layer includes a hole transport layer (HTL), an electroluminescent layer (EL), and an electron transport layer (ETL). When the power is supplied to an appropriate voltage, positive electrode holes and cathode electrons are combined in a light-emitting layer to illuminate, and three primary colors of red, green, and blue (RGB) are generated according to different formulas to form a basic color. Characteristics of OLED display devices are that they emit light by themselves, unlike liquid crystal displays (LCDs) requiring a backlight, so both visibility and brightness are high. Secondly, they have low voltage demand and high power saving efficiency, plus advantages of fast response times, being light in weight, thin thickness, a simple structure, wide viewing angles, flexibility, a wide operating temperature range, and low cost. Therefore, they have always been favored by the industry, and are considered to be the most promising new generation display technologies.

Studies have shown that compositions of water vapor and oxygen in the air have a great influence on a lifespan of OLED illuminating devices. The main reasons are as follows: when the OLED illuminating devices operate, electrons are injected from a cathode, which requires that a cathode function is as low as possible, by using metal materials such as aluminum, magnesium, calcium, etc. These metal materials are generally relatively active and easily react with influent water vapor. In addition, water vapor also chemically reacts with the hole transport layer and the electron transport layer, and these reactions all cause failure of the OLED illuminating device.

OLED illuminating devices need to inject electrons from the cathode when working, which requires that a cathode work function to be the lower the better, such as metal materials such as aluminum, magnesium, and calcium, which are generally more active and easily react with the influent water vapor. In addition, water vapor also chemically reacts with the hole transport layer and the electron transport layer, and these reactions all cause failure of the OLED illuminating device. Therefore, the lifespan of the device can be greatly extended by an effective packaging of the OLED illuminating device, so that functional layers of the device are separated from the components of water vapor, oxygen, and the like in the atmosphere.

In order to protect the OLED illuminating device from water and oxygen, it is usually implemented by thin film encapsulation (TFE), but short-wavelength ultraviolet light is generated during the preparation of the TFE, so an organic layer and an inorganic layer are encapsulated on the OLED metal cathode to avoid damage of the OLED illuminating device by the ultraviolet light and to block the penetration of water, oxygen, and other components, simultaneously. However, conventional package structures and metal cathodes have relatively low heat transfer rates. Heat generated inside the OLED illuminating device cannot be transmitted to the outside in time, and the heat will accumulate inside the OLED illuminating device, and the OLED illuminating device is damaged when the heat is accumulated to a certain extent.

SUMMARY OF DISCLOSURE

An object of the present disclosure is to provide a method of fabricating a graphene material, an organic light-emitting diode (OLED) illuminating device, and a display device, to solve problems of low heat conduction efficiency and heat damage of an OLED illuminating device in the prior art.

To achieve the above object, the present disclosure provides a method of fabricating a graphene material comprising:

a step of synthesizing a target object, comprising:
   placing flake graphite, sodium nitrate and potassium permanganate into a reaction vessel with sulfuric acid respectively to obtain a mixture, and performing a first preset temperature reaction, a second preset temperature reaction, and a third preset temperature reaction to the mixture sequentially, to obtain a first reaction solution;
   adding a reducing agent into the first reaction solution to reduce residual oxides, and adding hydrochloric acid into the reducing agent for fully reacting, to obtain a mixed solution; and
   purifying and drying the mixed solution to obtain the target object; and
a step of reducing the target object, comprising:
   performing a reducing treatment to the target object, to obtain the graphene material.

Further, in the step of synthesizing the target object, the first preset temperature reaction is performed to fully react at a temperature of 0 to 10° C.; the second preset temperature reaction is to add water into the reaction vessel at a temperature of 25 to 40° C. for fully reacting; and the third preset temperature reaction is to add water into the reaction vessel at a temperature of 90 to 100° C. for fully reacting.

Further, in the step of synthesizing the target object, a concentration of the sulfuric acid ranges from 70% to 98%; a concentration of the hydrochloric acid ranges from 0% to 20%; and the reducing agent is hydrogen peroxide.

Further, the step of reducing the target object comprises: placing the target object into the reaction vessel, adding water and stirring the target object, and sufficiently dispersing the target object to obtain a dispersion solution; adding ascorbic acid into the dispersion solution to obtain a mixing solution, sealing the mixing solution for fully reacting to obtain a second reaction solution; adding inorganic nanoparticles into the second reaction solution, and reacting at a temperature ranging from 150° C. to 250° C. to obtain the target solution; and vacuum-filtering, washing and drying the target solution after cooling the target solution to room temperature, to obtain the graphene material.

The present disclosure further provides an organic light-emitting diode (OLED) illuminating device, comprising a substrate, an anode layer, a cathode layer, an organic coating layer, a graphene material, and/or a graphene material layer.

The anode layer is disposed on the substrate. The cathode layer is disposed on the anode layer. The organic coating layer is disposed above the cathode layer. The graphene material is fabricated by the method of fabricating the graphene material, wherein the graphene material is doped in at least one of the anode layer, the cathode, and the organic coating layer; and/or wherein the graphene material is disposed between the anode layer and the substrate and/or between the organic coating layer and the cathode layer, to form a graphene material layer.

Further, the OLED illuminating device further comprises an organic illuminating layer, an inorganic protective layer, and a thin film layer. The organic illuminating layer is disposed between the anode layer and the cathode layer. The inorganic protective layer is disposed above the organic coating layer. The thin film layer is disposed above the inorganic protective layer.

Further, the organic illuminating layer further comprises a hole transport layer, a composite illuminating layer, and an electron transport layer. The hole transport layer is disposed above the anode layer. The composite illuminating layer is disposed above the hole transport layer. The electron transport layer is disposed above the composite illuminating layer.

Further, the inorganic protective layer is one of lithium fluoride, silicon oxide, silicon nitride, and silicon oxynitride.

Further, the anode layer is an indium tin oxide conductive glass.

The present disclosure further provides a display device comprising an organic light-emitting diode (OLED) illuminating device described above.

Advantages of the disclosure are that: the graphene material fabricated by the method of fabricating the graphene material provided by the disclosure has the advantages of good quality, no impurity, high yield, low cost and the like.

The OLED illuminating device provided by the disclosure adds a graphene material in a layered structure. The graphene has excellent electrical properties, excellent optical properties, and outstanding thermal conductivity, which can effectively transferring heat generated in the OLED illuminating device to the outside, to improve a thermal conduction rate of the OLED illuminating device and reduce damage of the OLED illuminating device by heat. The OLED illuminating device can further block water and oxygen, effectively protect the OLED illuminating device, and improve a service life of the OLED illuminating device. At the same time, the OLED illuminating device can improve a light transmittance of the cathode.

The display device provided by the present disclosure includes the above OLED light-emitting device, and the display device has a more delicate display screen and a relatively long service life.

The components in the figure are as follows:
OLED illuminating device 100;
substrate 10;
anode layer 20;
organic illuminating layer 30;
electron transport layer 31;
composite illuminating layer 32;
hole transport layer 33;
cathode layer 40;
graphene material layer 50;
organic coating layer 60;
inorganic protective layer 70; and
film layer 80.

DETAILED DESCRIPTION OF PREFERRED EMBODIMENTS

Three preferred embodiments of the present disclosure are described in the following with reference to accompanying drawings, which demonstrate that the present disclosure can be implemented, and the present disclosure can be fully described for those skilled in the art to make the technical content clearer and easier to understand. The present disclosure may be embodied in many different forms of embodiments, and scope of the present disclosure is not limited to the embodiments disclosed herein.

In the drawings, structurally identical components are denoted by same reference numerals, and structural or functionally similar components are denoted by like reference numerals. Dimensions and thickness of each component shown in the drawings are arbitrarily shown, and the disclosure does not limit the size and thickness of each component. In order to make the illustration clearer, some parts of the drawing appropriately exaggerate the thickness of the parts.

In addition, the description of the following embodiments is provided to illustrate specific embodiments in which the disclosure may be practiced. The directional terms mentioned in the present disclosure, for example, "upper", "lower", "front", "back", "left", "right", "inside", "outside", "side", etc., are merely directions referring to the adding drawings. Therefore, the directional terminology used is for the purpose of illustration and understanding of the disclosure, rather than indicating or implying that the device or component referred to has a particular orientation, construction, and operation in a particular orientation. Therefore, it is not to be construed as limiting the disclosure. Moreover, the terms "first", "second", "third", and the like are used for descriptive purposes only and are not to be construed as indicating or implying relative importance.

When some components are described as "on" another component, the components may be placed directly on the another component; or may also be an intermediate component in which the component is placed on the intermediate component, and the intermediate component is placed on the another component. When a component is described as "mounted to" or "connected to" another component, both of them may be understood to be "mounted" or "connected"

directly, or a component is "mounted to" or "connected" to another component through an intermediate component.

Embodiment 1

Figure 1:
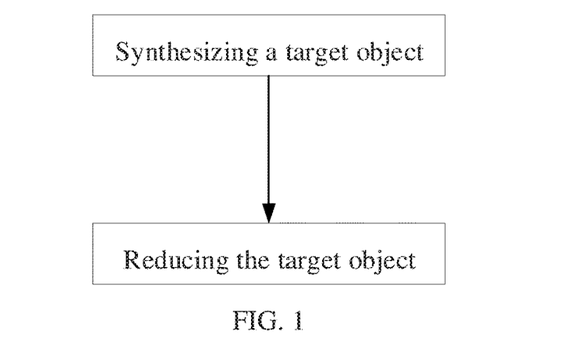
FIG. 1 is a schematic flow chart of a method for fabricating a graphene material according to embodiment 1 of the present disclosure.

The present embodiment provides a method of fabricating a graphene material. The fabricating process is shown in FIG. 1. The specific fabricating steps are as follows:

Synthesizing a Target Object:

25 ml of concentrated sulfuric acid ($H_2SO_4$) having a mass concentration of 98% is placed in a reaction vessel. The reaction vessel is placed in an ice water environment at 0° C. to 5° C. for 10 minutes of magnetic stirring. After the stirring is completed, 1 g of flake graphite and 0.5 g of sodium nitrate ($NaNO_3$) are successively added into the reaction vessel in small amounts and stirred for 30 minutes, and then 4.5 g of potassium permanganate ($KMnO_4$) is slowly added within 1 hour and is further stirred for 30 minutes, to perform a first predetermined temperature reaction. After the first predetermined temperature reaction is completed, the reaction vessel is placed in a warm water environment of 30° C. to 40° C. for 2 hours with magnetic stirring for performing a second predetermined temperature reaction. After the second predetermined temperature reaction is completed, 90 ml of high-purity water is slowly added into the reaction vessel, and magnetic stirring is performed in the reaction vessel in a boiling water environment of 95° C. to 100° C. for 18 minutes, and then 60 ml of high-purity water is slowly added for performing a third predetermined temperature reaction. After the reaction is completed, a first reaction solution is obtained.

25 ml of 30% by mass of hydrogen peroxide ($H_2O_2$) is slowly added into the first reaction solution to reduce residual oxide. After 15 minutes, 40 ml of dilute hydrochloric acid (HCl) having a mass concentration of 10% is added to carry out the reaction, and after fully reacting, a mixed solution is obtained.

The mixed solution is subjected to a plurality of centrifugation washing purification operations until it is detected to have a pH of about 7 and a barium chloride ($BaCl_2$) solution is used until sulfate ions are absent. The mixed solution is purified to obtain a brownish yellow viscous matter, wherein the brownish yellow viscous matter is transferred to a polytetrafluoroethylene evaporating dish and dried at a temperature of 45° C. for 24 hours to obtain a target object, i.e., graphite oxide (GO).

Reducing the Target Object:

100 mg of graphite oxide is placed in a reaction vessel, and 20 ml of high-purity water is added thereto, and ultrasonic stirring and magnetic stirring are alternately carried out, and a dispersion solution is obtained after fully stirring and dispersing.

100 mg of ascorbic acid is added into the dispersion solution and is ultrasonically stirred or magnetically stirred for 30 minutes. Then, the reaction vessel is sealed and stands for 24 hours for fully reacting, to obtain a second reaction solution.

The second reaction solution is poured into a hydrothermal reaction kettle, and 60 ml of absolute ethanol, 10 mg of carbon nanotubes, or inorganic nanoparticles are added into the hydrothermal reaction kettle. After ultrasonic stirring for 10 minutes, the hydrothermal reaction kettle is placed in an environment at a temperature of 180° C., and the temperature is maintained for 12 hours for fully reacting, to obtain a target solution.

After cooling the target solution to room temperature, it is subjected to multiple vacuum filtration washing until the pH of a filtering solution is about 7, to obtain the graphene material, i.e., a graphene nanosheet.

Figure 2:
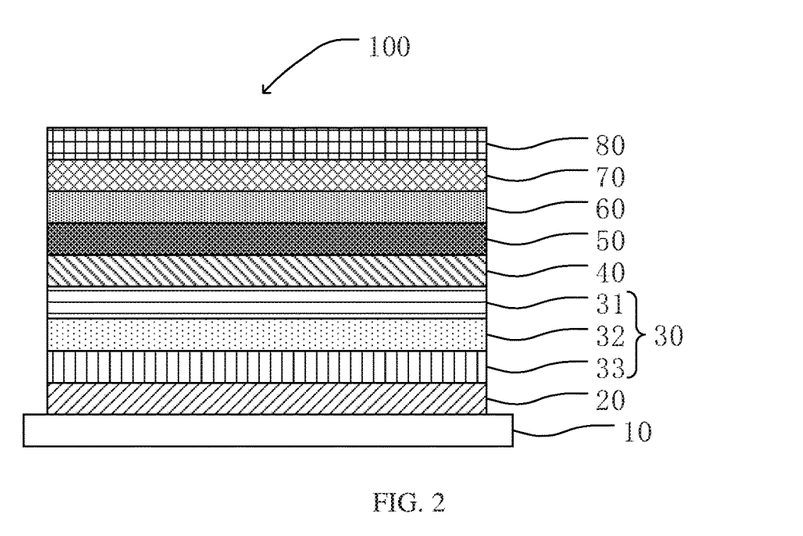
FIG. 2 is a schematic diagram showing a layered structure of an organic light-emitting diode (OLED) illuminating device according to embodiment 1 or 3 of the present disclosure.

As shown in FIG. 2, the present embodiment further provides an organic light-emitting diode (OLED) illuminating device 100 comprising a substrate 10, an organic illuminating layer 30, an anode layer 20, a cathode layer 40, a graphene material layer 50, an organic coating layer 60, an inorganic protective layer 70, and a thin film layer 80.

The organic illuminating layer 30 further comprises a hole transport layer 33, a composite illuminating layer 32, and an electron transport layer 31. The hole transport layer 33 is adhesive to a lower surface of the composite illuminating layer 32, and the electron transport layer 31 is adhesive to an upper surface of the composite illuminating layer 32. The electron transport layer 31 and the hole transport layer 33 are both made of an organic material, and material of the electron transport layer 31 is usually a fluorescent dye compound such as organic materials, e.g., Alq [8-hydroxyquinoline aluminum], Znq [8-hydroxyquinoline zinc salt], Lip [8-hydroxyquinoline-lithium], Bebq [bis(10-hydroxybenzo[h]quinoline) beryllium], Balq [bis(2-methyl-8-hydroxyquinoline-N1,08)-(1,1'-biphenyl-4-hydroxy)aluminum], or DPVBi [4,4'-bis(2,2-distyryl)-1,1'-biphenyl]. Material of the hole transport layer 33 is usually an aromatic amine fluorescent compound, such as organic materials, e.g., TPD [N, N'-diphenyl-N, N'-bis(3-methylphenyl)-1,1'-biphenyl-4,4'-diamine], TDATA [4,4'4"-tris(N,N-diphenylamino) triphenylamine], NPB[N,N'-diphenyl-N,N'-(1-naphthyl)-1,1'-biphenyl-4,4'-diamine]. Material of the composite illuminating layer 32 is generally the same as that of the electron transport layer 31 or the hole transport layer 33, which generates light of different colors by different raw materials, for example, Alq is widely used for green light, Balq is widely used for red light, and DPVBi is widely used for blue light.

A lower surface of the hole transport layer 33 is covered with an anode layer 20, and an upper surface of the electron transport layer 31 is covered with the cathode layer 40. The anode layer 20 and the cathode layer 40 provide electrical power to the organic illuminating layer 30. When supplied to an appropriate voltage, holes in the hole transport layer 33 and electrons in the electron transport layer 31 are combined to cause the composite illuminating layer 32 to be bright. The anode layer 20 is an indium tin oxide conductive glass having a work function higher than 4.5 eV and has excellent light transmission capability. The cathode layer 40 is a metal or alloy having a work function lower than 4.5 eV, such as magnesium, aluminum, silver, calcium, indium, lithium, silver-magnesium alloy, etc., not only can achieve efficient injection of electrons, but also has a certain light transmission capability, simultaneously. An illuminating efficiency of the OLED illuminating device 100 can be effectively improved.

The graphene material layer 50 is disposed between the cathode layer 40 and the organic coating layer 60, and the graphene material layer 50 is a graphene nanosheet. The graphene nanosheet can be fabricated by the above-described method of fabricating the graphene material and is deposited on an upper surface of the cathode layer 40 by a vacuum evaporation process to form the graphene material layer 50. The graphene nanosheet is a two-dimensional sheet-like structure and has excellent thermal conductivity, and can quickly conduct heat inside the organic light-emitting diode device to the outside of the device, thereby avoiding excessive heat inside the device and also blocking water and oxygen, simultaneously.

Since metal or alloy used for the cathode layer 40 is poor in stability and easily reacts with water and oxygen, it is necessary to provide an organic coating layer 60, an inorganic protective layer 70, and a thin film layer 80 to protect the OLED illuminating device 100 from water and oxygen, to extend the service life of the OLED illuminating device 100. The organic coating layer 60 is disposed above the cathode layer 40, the inorganic protective layer 70 is disposed above the organic coating layer 60, and the thin film layer 80 is disposed above the inorganic protective layer 70. The thin film layer 80 is generally realized by thin film encapsulation (TFE), which can effectively block water and oxygen and can prevent various components in the organic light-emitting diode from changing. The inorganic protective layer 70 can be an inorganic material such as lithium fluoride, silicon oxide, silicon nitride, or silicon oxynitride, which can block short-wavelength ultraviolet light generated when the thin film layer 80 is fabricated, and further block the penetration of components of water, oxygen, and the like. The organic coating layer 60 can be an organic material such as a polyacrylate or an acrylate emulsion and has flexibility and elasticity, which can reduce damage of the OLED illuminating device 100 in a fabricating process of the inorganic protective layer 70 and the thin film layer 80, and the organic coating layer 60 can be used to affix and reinforce the inorganic protective layer 70, to solve the problem that the inorganic protective layer 70 is easy to fall off, and water and oxygen can also be blocked, simultaneously.

A substrate 10 is disposed on a lower surface of the anode layer 20, which is generally a glass substrate, to protect a whole structure of the OLED illuminating device 100.

In this embodiment, a display device (not shown) is further provided, which has the above-described OLED illuminating device 100, which can be any product or component having a display function, such as a mobile phone, a tablet computer, a notebook computer, a digital camera, and the like.

The graphene material fabricated by the method of fabricating a graphene material provided in this embodiment has the advantages of good quality, no impurity, high yield, low cost, and the like. The OLED illuminating device 100 provided in the present embodiment has excellent thermal conductivity and an optical ability by adding the graphene material layer 50 between the cathode layer 40 and the organic coating layer 60, wherein the graphene material layer 50 is a graphene nanosheet. The heat generated in the device can be effectively and quickly conducted to the outside of the device without affecting the illumination of the OLED illuminating device 100, thereby avoiding a situation that an internal temperature of the device is too high and the internal device is burned and damaged. The graphene material layer 50 can further block water and oxygen, to further reduce the influence of water and oxygen on the cathode layer 40 and other components and to extend the service life of the OLED illuminating device 100 and the display device.

Embodiment 2

The present embodiment provides a method of fabricating a graphene material. The fabricating process is shown in FIG. 1. The specific fabricating steps are as follows:

Synthesizing a Target Object:

25 ml of concentrated sulfuric acid ($H_2SO_4$) having a mass concentration of 98% is placed in a reaction vessel. The reaction vessel is placed in an ice water environment at 0° C. to 5° C. for 10 minutes of magnetic stirring. After the stirring is completed, 1 g of flake graphite and 0.5 g of sodium nitrate ($NaNO_3$) are successively added into the reaction vessel in small amounts and stirred for 30 minutes, and then 4.5 g of potassium permanganate ($KMnO_4$) is slowly added within 1 hour and is further stirred for 30 minutes, to perform a first predetermined temperature reaction. After the first predetermined temperature reaction is completed, the reaction vessel is placed in a warm water environment of 30° C. to 40° C. for 2 hours with magnetic stirring for performing a second predetermined temperature reaction. After the second predetermined temperature reaction is completed, 90 ml of high-purity water is slowly added into the reaction vessel, and magnetical stirring is performed in the reaction vessel in a boiling water environment of 95° C. to 100° C. for 18 minutes, and then 60 ml of high-purity water is slowly added for performing a third predetermined temperature reaction. After the reaction is completed, a first reaction solution is obtained.

25 ml of 30% by mass of hydrogen peroxide ($H_2O_2$) is slowly added into the first reaction solution to reduce residual oxide. After 15 minutes, 40 ml of dilute hydrochloric acid (HCl) having a mass concentration of 10% is added to carry out the reaction, and after fully reacting, a mixed solution is obtained.

The mixed solution is subjected to a plurality of centrifugation washing purification operations until it is detected to have a pH of about 7 and a barium chloride ($BaCl_2$) solution is used until sulfate ions are absent. The mixed solution is purified to obtain a brownish yellow viscous matter, wherein the brownish yellow viscous matter is transferred to a polytetrafluoroethylene evaporating dish and dried at a temperature of 45° C. for 24 hours to obtain a target object, i.e., graphite oxide (GO).

Reducing the Target Object:

100 mg of graphite oxide is placed in a reaction vessel, and 20 ml of high-purity water is added thereto, and ultrasonic stirring and magnetic stirring are alternately carried out, and a dispersion solution is obtained after fully stirring and dispersing.

100 mg of ascorbic acid is added into the dispersion solution and is ultrasonically stirred or magnetically stirred for 30 minutes. Then, the reaction vessel is sealed and stands for 24 hours for fully reacting, to obtain a second reaction solution.

The second reaction solution is poured into a hydrothermal reaction kettle, and 60 ml of absolute ethanol, 10 mg of carbon nanotubes, or inorganic nanoparticles are added into the hydrothermal reaction kettle. After ultrasonic stirring for 10 minutes, the hydrothermal reaction kettle is placed in an environment at a temperature of 180° C., and the temperature is maintained for 12 hours for fully reacting, to obtain a target solution.

After cooling the target solution to room temperature, it is subjected to multiple vacuum filtration washing until the pH of a filtering solution is about 7, to obtain the graphene material, i.e., a graphene nanosheet.

Figure 3:
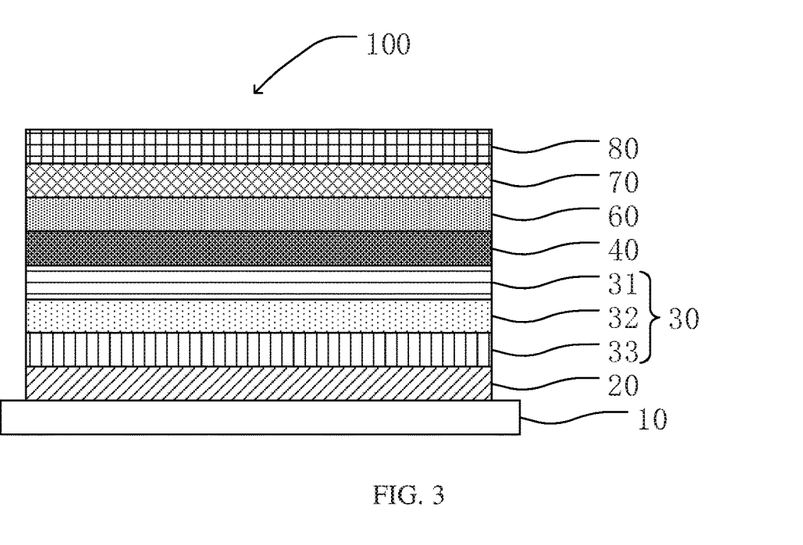
FIG. 3 is a schematic diagram showing a layered structure of an OLED light-emitting device according to embodiment 2 of the present disclosure.

As shown in FIG. 3, the present embodiment further provides an organic light-emitting diode (OLED) illuminating device 100 comprising a substrate 10, an organic illuminating layer 30, an anode layer 20, a cathode layer 40, an organic coating layer 60, an inorganic protective layer 70, and a thin film layer 80.

The organic illuminating layer 30 further comprises a hole transport layer 33, a composite illuminating layer 32, and an electron transport layer 31. The hole transport layer 33 is adhesive to a lower surface of the composite illuminating layer 32, and the electron transport layer 31 is adhesive to an upper surface of the composite illuminating layer 32. The electron transport layer 31 and the hole transport layer 33 are both made of an organic material, and material of the electron transport layer 31 is usually a fluorescent dye compound such as organic materials, e.g., Alq [8-hydroxyquinoline aluminum], Znq [8-hydroxyquinoline zinc salt], Lip [8-hydroxyquinoline-lithium], Bebq [bis(10-hydroxybenzo[h]quinoline) beryllium], Balq [bis(2-methyl-8-hydroxyquinoline-N1,08)-(1,1'-biphenyl-4-hydroxy)aluminum], or DPVBi [4,4'-bis(2,2-distyryl)-1,1'-biphenyl]. Material of the hole transport layer 33 is usually an aromatic amine fluorescent compound, such as organic materials, e.g., TPD [N, N'-diphenyl-N, N'-bis(3-methylphenyl)-1,1'-biphenyl-4,4'-diamine], TDATA [4,4'4"-tris(N,N-diphenylamino)triphenylamine], NPB[N,N'-diphenyl-N,N'-(1-naphthyl)-1,1'-biphenyl-4,4'-diamine]. Material of the composite illuminating layer 32 is generally the same as that of the electron transport layer 31 or the hole transport layer 33, which generates light of different colors by different raw materials, for example, Alq is widely used for green light, Balq is widely used for red light, and DPVBi is widely used for blue light.

A lower surface of the hole transport layer 33 is covered with an anode layer 20, and an upper surface of the electron transport layer 31 is covered with a cathode layer 40. The anode layer 20 and the cathode layer 40 provide electrical power to the organic illuminating layer 30. When supplied to an appropriate voltage, holes in the hole transport layer 33 and electrons in the electron transport layer 31 are combined to cause the composite illuminating layer 32 to be bright. The anode layer 20 is an indium tin oxide conductive glass having a work function higher than 4.5 eV and has excellent light transmission capability. The cathode layer 40 is a metal or alloy having a work function lower than 4.5 eV, such as magnesium, aluminum, silver, calcium, indium, lithium, silver-magnesium alloy, etc., not only can achieve efficient injection of electrons, but also has a certain light transmission capability, simultaneously. An illuminating efficiency of the OLED illuminating device 100 can be effectively improved.

In this embodiment, the cathode layer 40 is further doped with a graphene material. The graphene material is a graphene nanosheet, which can be fabricated by the above method of fabricating the graphene material. The graphene nanosheet may be co-evaporated in the cathode layer 40 with a metal or alloy by a vacuum evaporation process. The graphene nanosheet is a two-dimensional sheet-like structure and has excellent thermal conductivity and an optical ability, and can quickly conduct heat inside the organic light-emitting diode device to the outside of the device, thereby avoiding excessive heat inside the device and improving the transmittance of the cathode layer 40, simultaneously.

Since metal or alloy used for the cathode layer 40 is poor in stability and easily reacts with water and oxygen, it is necessary to provide an organic coating layer 60, an inorganic protective layer 70, and a thin film layer 80 to protect the OLED illuminating device 100 from water and oxygen, to extend the service life of the OLED illuminating device 100. The organic coating layer 60 is disposed above the cathode layer 40, the inorganic protective layer 70 is disposed above the organic coating layer 60, and the thin film layer 80 is disposed above the inorganic protective layer 70. The thin film layer 80 is generally realized by thin film encapsulation (TFE), which can effectively block water and oxygen and can prevent various components in the organic light-emitting diode from changing. The inorganic protective layer 70 can be an inorganic material such as lithium fluoride, silicon oxide, silicon nitride, or silicon oxynitride, which can block short-wavelength ultraviolet light generated when the thin film layer 80 is fabricated, and further block the penetration of components of water, oxygen, and the like. The organic coating layer 60 can be an organic material such as a polyacrylate or an acrylate emulsion and has flexibility and elasticity, which can reduce damage of the OLED illuminating device 100 in a fabricating process of the inorganic protective layer 70 and the thin film layer 80, and the organic coating layer 60 can be used to affix and reinforce the inorganic protective layer 70, to solve the problem that the inorganic protective layer 70 is easy to fall off, and water and oxygen can also be blocked, simultaneously.

A substrate 10 is disposed on a lower surface of the anode layer 20, which is generally a glass substrate, to protect a whole structure of the OLED illuminating device 100.

In this embodiment, a display device (not shown) is further provided, which has the above-described OLED illuminating device 100, which can be any product or component having a display function, such as a mobile phone, a tablet computer, a notebook computer, a digital camera, and the like.

The graphene material fabricated by the method of fabricating a graphene material provided in this embodiment has the advantages of good quality, no impurity, high yield, low cost, and the like. The OLED illuminating device 100 provided in the present embodiment has an excellent thermal conductivity, an optical ability, and a conductive ability by adding the graphene material into the cathode layer 40 wherein the graphene material layer 50 is a graphene nanosheet. The heat generated in the device can be effectively and quickly conducted to the outside of the device without affecting the electrical performance of the cathode layer 40, thereby avoiding the situation that the internal temperature of the device is too high and the internal device is burned and damaged, thereby extending the service life of the OLED illuminating device 100 and the display device, and improving the light transmittance of the cathode layer 40, simultaneously.

Embodiment 3

The present embodiment provides a method of fabricating a graphene material. The fabricating process is shown in FIG. 1. The specific fabricating steps are as follows:

Synthesizing a Target Object:

25 ml of concentrated sulfuric acid ($H_2SO_4$) having a mass concentration of 98% is placed in a reaction vessel. The reaction vessel is placed in an ice water environment at 0° C. to 5° C. for 10 minutes of magnetic stirring. After the stirring is completed, 1 g of flake graphite and 0.5 g of sodium nitrate ($NaNO_3$) are successively added into the reaction vessel in small amounts and stirred for 30 minutes, and then 4.5 g of potassium permanganate ($KMnO_4$) is slowly added within 1 hour and is further stirred for 30 minutes, to perform a first predetermined temperature reaction. After the first predetermined temperature reaction is completed, the reaction vessel is placed in a warm water environment of 30° C. to 40° C. for 2 hours with magnetic stirring for performing a second predetermined temperature reaction. After the second predetermined temperature reaction is completed, 90 ml of high-purity water is slowly added into the reaction vessel, and magnetical stirring is performed in the reaction vessel in a boiling water environment of 95°

C. to 100° C. for 18 minutes, and then 60 ml of high-purity water is slowly added for performing a third predetermined temperature reaction. After the reaction is completed, a first reaction solution is obtained.

25 ml of 30% by mass of hydrogen peroxide ($H_2O_2$) is slowly added into the first reaction solution to reduce residual oxide. After 15 minutes, 40 ml of dilute hydrochloric acid (HCl) having a mass concentration of 10% is added to carry out the reaction, and after fully reacting, a mixed solution is obtained.

The mixed solution is subjected to a plurality of centrifugation washing purification operations until it is detected to have a pH of about 7 and a barium chloride ($BaCl_2$) solution is used until sulfate ions are absent. The mixed solution is purified to obtain a brownish yellow viscous matter, wherein the brownish yellow viscous matter is transferred to a polytetrafluoroethylene evaporating dish and dried at a temperature of 45° C. for 24 hours to obtain a target object, i.e., graphite oxide (GO).

Reducing the Target Object:

100 mg of graphite oxide is placed in a reaction vessel, and 20 ml of high-purity water is added thereto, and ultrasonic stirring and magnetic stirring are alternately carried out, and a dispersion solution is obtained after fully stirring and dispersing.

100 mg of ascorbic acid is added into the dispersion solution and is ultrasonically stirred or magnetically stirred for 30 minutes. Then, the reaction vessel is sealed and stands for 24 hours for fully reacting, to obtain a second reaction solution.

The second reaction solution is poured into a hydrothermal reaction kettle, and 60 ml of absolute ethanol, 10 mg of carbon nanotubes, or inorganic nanoparticles are added into the hydrothermal reaction kettle. After ultrasonic stirring for 10 minutes, the hydrothermal reaction kettle is placed in an environment at a temperature of 180° C., and the temperature is maintained for 12 hours for fully reacting, to obtain a target solution.

After cooling the target solution to room temperature, it is subjected to multiple vacuum filtration washing until the pH of a filtering solution is about 7, to obtain the graphene material, i.e., a graphene nanosheet.

As shown in FIG. 2, the present embodiment further provides an organic light-emitting diode (OLED) illuminating device 100 comprising a substrate 10, an organic illuminating layer 30, an anode layer 20, a cathode layer 40, a graphene material layer 50, an organic coating layer 60, an inorganic protective layer 70, and a thin film layer 80.

The organic illuminating layer 30 further comprises a hole transport layer 33, a composite illuminating layer 32, and an electron transport layer 31. The hole transport layer 33 is adhesive to a lower surface of the composite illuminating layer 32, and the electron transport layer 31 is adhesive to an upper surface of the composite illuminating layer 32. The electron transport layer 31 and the hole transport layer 33 are both made of an organic material, and material of the electron transport layer 31 is usually a fluorescent dye compound such as organic materials, e.g., Alq [8-hydroxyquinoline aluminum], Znq [8-hydroxyquinoline zinc salt], Lip [8-hydroxyquinoline-lithium], Bebq [bis(10-hydroxybenzo[h]quinoline) beryllium], Balq [bis(2-methyl-8-hydroxyquinoline-N1,08)-(1,1'-biphenyl-4-hydroxy)aluminum], or DPVBi [4,4'-bis(2,2-distyryl)-1,1'-biphenyl]. Material of the hole transport layer 33 is usually an aromatic amine fluorescent compound, such as organic materials, e.g., TPD [N, N'-diphenyl-N, N'-bis(3-methylphenyl)-1,1'-biphenyl-4,4'-diamine], TDATA [4,4'4''-tris(N,N-diphenylamino) triphenylamine], NPB[N,N'-diphenyl-N,N'-(1-naphthyl)-1, 1'-biphenyl-4,4'-diamine]. Material of the composite illuminating layer 32 is generally the same as that of the electron transport layer 31 or the hole transport layer 33, which generates light of different colors by different raw materials, for example, Alq is widely used for green light, Balq is widely used for red light, and DPVBi is widely used for blue light.

A lower surface of the hole transport layer 33 is covered with an anode layer 20, and an upper surface of the electron transport layer 31 is covered with the cathode layer 40. The anode layer 20 and the cathode layer 40 provide electrical power to the organic illuminating layer 30. When supplied to an appropriate voltage, holes in the hole transport layer 33 and electrons in the electron transport layer 31 are combined to cause the composite illuminating layer 32 to be bright. The anode layer 20 is an indium tin oxide conductive glass having a work function higher than 4.5 eV and has excellent light transmission capability. The cathode layer 40 is a metal or alloy having a work function lower than 4.5 eV, such as magnesium, aluminum, silver, calcium, indium, lithium, silver-magnesium alloy, etc., not only can achieve efficient injection of electrons, but also has a certain light transmission capability, simultaneously. Illuminating efficiency of the OLED illuminating device 100 can be effectively improved.

In this embodiment, the cathode layer 40 is further doped with a graphene material. The graphene material is a graphene nanosheet, which can be fabricated by the above method of fabricating the graphene material. The graphene nanosheet may be co-evaporated in the cathode layer 40 with a metal or alloy by a vacuum evaporation process. The graphene nanosheet is a two-dimensional sheet-like structure and has excellent thermal conductivity and an optical ability, and can quickly conduct heat inside the organic light-emitting diode device to the outside of the device, thereby avoiding excessive heat inside the device and improving the transmittance of the cathode layer 40, simultaneously.

Meanwhile, the graphene material layer 50 is further disposed between the cathode layer 40 and the organic coating layer 60, and the graphene material layer 50 is also a graphene nanosheet, which can also be fabricated by the above method of fabricating the graphene material. The graphene material layer 50 is formed by vapor deposition on the upper surface of the cathode layer 40 by a vacuum evaporation process.

Since metal or alloy used for the cathode layer 40 is poor in stability and easily reacts with water and oxygen, it is necessary to provide the organic coating layer 60, the inorganic protective layer 70, and the thin film layer 80 to protect the OLED illuminating device 100 from water and oxygen, to extend the service life of the OLED illuminating device 100. The organic coating layer 60 is disposed above the cathode layer 40, the inorganic protective layer 70 is disposed above the organic coating layer 60, and the thin film layer 80 is disposed above the inorganic protective layer 70. The thin film layer 80 is generally realized by thin film encapsulation (TFE), which can effectively block water and oxygen and can prevent various components in the organic light-emitting diode from changing. The inorganic protective layer 70 can be an inorganic material such as lithium fluoride, silicon oxide, silicon nitride, or silicon oxynitride, which can block short-wavelength ultraviolet light generated when the thin film layer 80 is fabricated, and further block the penetration of components of water, oxygen, and the like. The organic coating layer 60 can be an organic material such as a polyacrylate or an acrylate emulsion and has flexibility and elasticity, which can reduce damage of the OLED illuminating device 100 in a fabricating process of the inorganic protective layer 70 and the thin film layer 80, and the organic coating layer 60 can be used to affix and reinforce the inorganic protective layer 70, to solve the problem that the inorganic protective layer 70 is easy to fall off, and water and oxygen can also be blocked, simultaneously.

A substrate 10 is disposed on a lower surface of the anode layer 20, which is generally a glass substrate, to protect a whole structure of the OLED illuminating device 100.

In this embodiment, a display device (not shown) is further provided, which has the above-described OLED illuminating device 100, which can be any product or component having a display function, such as a mobile phone, a tablet computer, a notebook computer, a digital camera, and the like.

The graphene material fabricated by the method of fabricating a graphene material provided in this embodiment has the advantages of good quality, no impurity, high yield, low cost, and the like. The OLED illuminating device 100 provided in the present embodiment has an excellent thermal conductivity, an optical ability, and a conductive ability by doping the graphene layer 40 with a graphene material and adding the graphene material layer 50 between the cathode layer 40 and the organic coating layer 60, wherein the graphene material layer 50 is a graphene nanosheet. The transfer of heat generated inside the device to the outside of the device can be further speeded up without affecting the electrical performance of the cathode layer 40, thereby avoiding the situation that the internal temperature of the device is too high and the internal device is burned and damaged, thereby extending the service life of the OLED illuminating device 100 and the display device, and improving the light transmittance of the cathode layer 40 and blocking water and oxygen.

In other embodiments of the present disclosure, the graphene material can also be doped in at least one of the anode layer 20 and the organic coating layer 60, and/or can also be disposed between the anode layer 20 and the substrate 10, to form the graphene material layer 50, wherein the fabricating method, technical effects, and the like of the graphene material are similar to those of the above embodiment, and therefore will not be described too much herein. All other embodiments obtained by those skilled in the art based on the embodiments of the present application without creative efforts are within the scope of the present application.

The description above is merely preferred embodiments of the present disclosure. It is noted that, for one skilled in the art, many changes and modifications to the described embodiment can be carried out without departing from the principles of the disclosure and these changes and modifications should also be considered as protection scope of the present disclosure.

The invention claimed is:

1. A method of fabricating a graphene material, comprising:
    a step of synthesizing a target object, comprising:
        placing flake graphite, sodium nitrate, and potassium permanganate into a reaction vessel with sulfuric acid respectively to obtain a mixture, and performing a first preset temperature reaction, a second preset temperature reaction, and a third preset temperature reaction to the mixture sequentially, to obtain a first reaction solution;
        adding a reducing agent into the first reaction solution to reduce residual oxides, and adding hydrochloric acid into the reducing agent for fully reacting, to obtain a mixed solution; and
        purifying and drying the mixed solution to obtain the target object; and
    a step of reducing the target object, comprising:
        performing a reducing treatment to the target object, to obtain the graphene material.

2. The method of fabricating the graphene material according to claim 1, wherein in the step of synthesizing the target object,
    the first preset temperature reaction is performed to fully react at a temperature of 0 to 10° C.;
    the second preset temperature reaction is to add water into the reaction vessel at a temperature of 25 to 40° C. for fully reacting; and
    the third preset temperature reaction is to add water into the reaction vessel at a temperature of 90 to 100° C. for fully reacting.

3. The method of fabricating the graphene material according to claim 1, wherein in the step of synthesizing the target object,
    a concentration of the sulfuric acid ranges from 70% to 98%;
    a concentration of the hydrochloric acid ranges from 0% to 20%; and
    the reducing agent is hydrogen peroxide.

4. The method of fabricating the graphene material according to claim 1, wherein the step of reducing the target object comprises:
    placing the target object into the reaction vessel, adding water and stirring the target object, and sufficiently dispersing the target object to obtain a dispersion solution;
    adding ascorbic acid into the dispersion solution to obtain a mixing solution, sealing the mixing solution for fully reacting to obtain a second reaction solution;
    adding inorganic nanoparticles into the second reaction solution, and reacting at a temperature ranging from 150° C. to 250° C. to obtain the target solution; and
    vacuum-filtering, washing and drying the target solution after cooling the target solution to room temperature, to obtain the graphene material.

5. An organic light-emitting diode (OLED) illuminating device, comprising:
    a substrate;
    an anode layer disposed on the substrate;
    a cathode layer disposed on the anode layer;
    an organic coating layer disposed above the cathode layer; and
    a graphene material fabricated by a method of fabricating the graphene material according to claim 1,
    wherein the graphene material is doped in at least one of the anode layer, the cathode, and the organic coating layer; and/or
    wherein the graphene material is disposed between the anode layer and the substrate and/or between the organic coating layer and the cathode layer, to form a graphene material layer.

6. The OLED illuminating device according to claim 5, further comprising:
    an organic illuminating layer disposed between the anode layer and the cathode layer;
    an inorganic protective layer disposed above the organic coating layer; and a thin film layer disposed above the inorganic protective layer.

7. The OLED illuminating device according to claim 6, wherein the organic illuminating layer further comprises:
   a hole transport layer disposed above the anode layer;
   a composite illuminating layer disposed above the hole transport layer; and
   an electron transport layer disposed above the composite illuminating layer.

8. The OLED illuminating device according to claim 6, wherein the inorganic protective layer is one of lithium fluoride, silicon oxide, silicon nitride, and silicon oxynitride.

9. The OLED illuminating device according to claim 5, wherein the anode layer is an indium tin oxide conductive glass.

10. A display device, comprising the organic light-emitting diode (OLED) illuminating device according to claim 5.

* * * * *

UNITED STATES PATENT AND TRADEMARK OFFICE
CERTIFICATE OF CORRECTION

| | |
|---|---|
| PATENT NO. | : 10,720,610 B2 |
| APPLICATION NO. | : 16/349651 |
| DATED | : July 21, 2020 |
| INVENTOR(S) | : Yue Zhang |

It is certified that error appears in the above-identified patent and that said Letters Patent is hereby corrected as shown below:

On the Title Page

Add (30) Foreign Application Priority Data:
"December 18, 2018 (CN) 201811548629.4"

Signed and Sealed this
Twenty-second Day of September, 2020

Andrei Iancu
*Director of the United States Patent and Trademark Office*